United States Patent [19]

Turner

[11] 4,416,760
[45] Nov. 22, 1983

[54] APPARATUS FOR ASYMMETRICALLY CONTOURING THE THICKNESS OF SPUTTER COATED LAYERS

[75] Inventor: Frederick T. Turner, Sunnyvale, Calif.

[73] Assignee: Varian Associates, Inc., Palo Alto, Calif.

[21] Appl. No.: 325,589

[22] Filed: Nov. 27, 1981

[51] Int. Cl.³ .............................................. C23C 15/00
[52] U.S. Cl. .................................. 204/298; 118/504; 118/720; 204/192 R
[58] Field of Search .............. 204/192 R, 192 C, 298; 118/720, 504

[56] References Cited

U.S. PATENT DOCUMENTS

| | | | |
|---|---|---|---|
| 3,904,503 | 9/1975 | Hanemann | 204/192 R |
| 4,303,489 | 12/1981 | Morrison, Jr. | 204/192 R |
| 4,315,960 | 2/1982 | Ohji et al. | 427/248.1 |
| 4,342,901 | 8/1982 | Zajac | 219/121 PD |

FOREIGN PATENT DOCUMENTS

| | | | |
|---|---|---|---|
| 53-33531 | 9/1978 | Japan | 204/192 R |
| 56-87664 | 7/1981 | Japan | 204/192 R |

Primary Examiner—Aaron Weisstuch
Attorney, Agent, or Firm—Stanley Z. Cole; Leon F. Herbert

[57] ABSTRACT

Apparatus for compensating for asymmetric signatures in semiconductor processes. An asymmetric thickness profile is obtained in a sputter coating system by using a shield placed in an asymmetric position with respect to the center of a symmetric sputtering system such as a circularly symmetric sputtering system. A sputter coated layer is obtained which has the asymmetric character of the shield and its placement. When the substrate is placed in subsequent equipment having asymmetric etch characteristics, the resultant film has a uniform thickness or a known contour.

6 Claims, 3 Drawing Figures

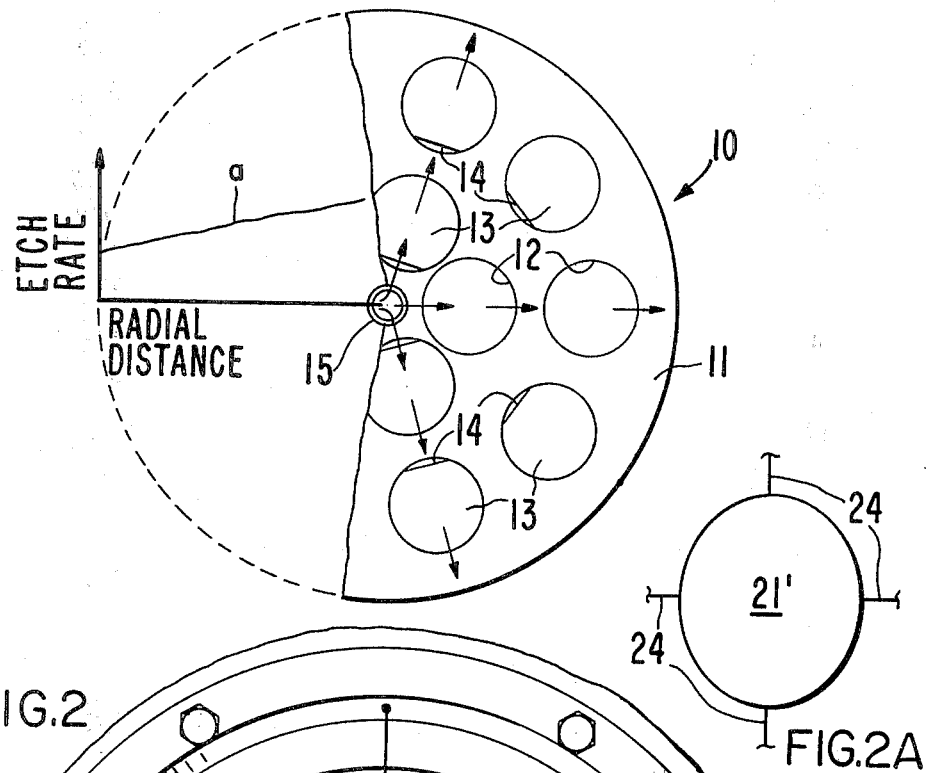
FIG.1
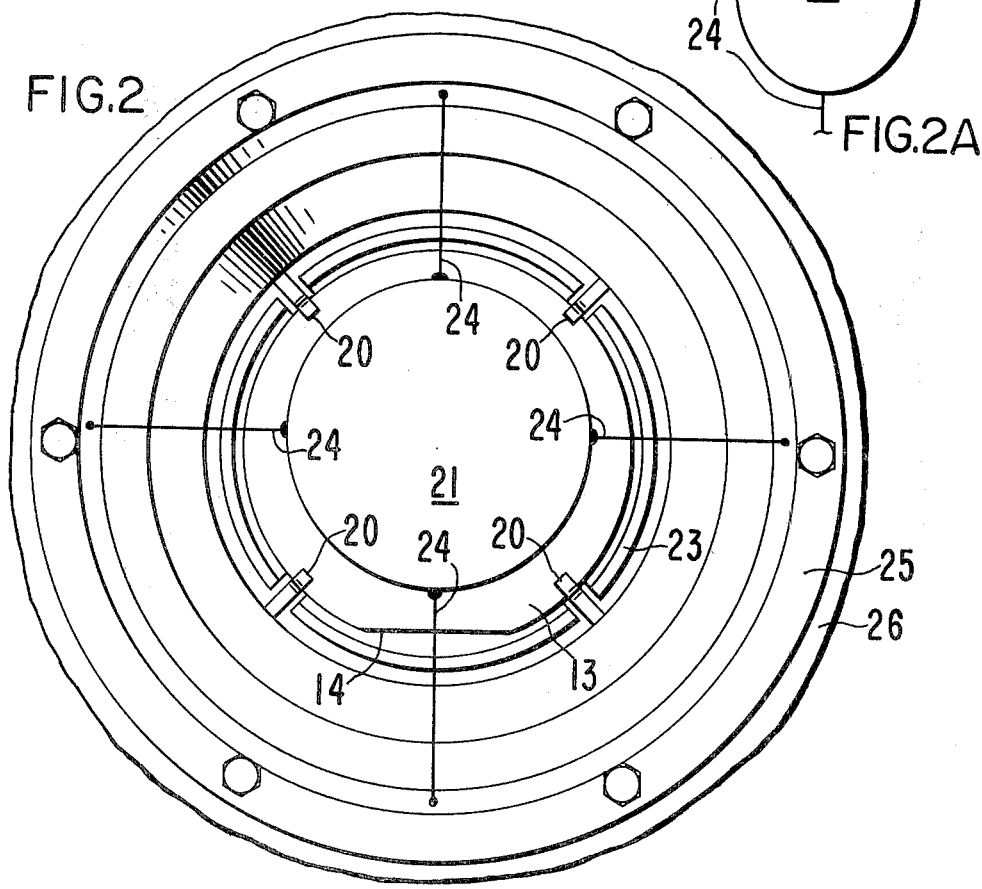
FIG.2
FIG.2A

4,416,760

APPARATUS FOR ASYMMETRICALLY CONTOURING THE THICKNESS OF SPUTTER COATED LAYERS

DESCRIPTION

This invention relates to apparatus for contouring the thickness of sputter coated layers, and more particularly, relates to apparatus for asymmetrically contouring the thickness of sputter coated layers.

BACKGROUND OF THE INVENTION

In the fabrication of semiconductor devices, it is increasingly important to precisely control the uniformity of thickness of coated layers. Uniformity in the thickness of coated layers can increase yield, improve the performance of individual semiconductor devices and may allow the devices across the wafer to more consistently meet a particular specification. When semiconductor wafers are coated by sputter coating, a material is sputtered off of a target cathode in such a manner that it deposits on the surface to be coated. See generally, R. W. Berry, et al., *Thin Film Technology*, (1968) and L. J. Maissel, et al., *Handbook of Thin Film Technology*, (1970). Such sputter coated films, for example, of aluminum, are employed for the metallization of integrated circuits. Heretofore, uneven films have either been tolerated or attempts have been made to shape the sputtering cathode or to arrange the geometry of the system in order to deposit as uniform a film as possible.

The conventional technique for contouring the thickness of the coating in a sputter deposited layer is to interpose a blocking shield inbetween the cathode target and the substrate. As disclosed in C. H. George, "Apparatus for Feeding and Coating Masses of Workpieces in a Controlled Atmosphere", U.S. Pat. No. 3,856,654, a fixed blocking shield may be inserted between a cathode target and a substrate. When the sputter coating from such a work station is combined with coating from unshielded stations, then a more uniform overall film may be obtained. Or, as disclosed in A. M. Hanfmann, "Depositing Material on a Substrate Using a Shield", U.S. Pat. No. 3,904,503, an arbitrarily shaped planar member is inserted between a cathode target and a source as the substrate moves linearly past or around the source. The shape of the edge of the planar member is selected to match the thickness contours of the substrate coated in the system without a shield. Thus, the inherent non-uniformities introduced by the system may be compensated. In both cases, since no shuttering is used, there is a leading edge and a trailing edge to the deposition as the substrate moves past the cathode. Also, due to the fact that either the substrate or the shield moves, and since the relative movement is essentially linear, it is not possible to produce contouring having asymmetry derived from the unique circular symmetry of a semiconductor wafer.

Every process practiced in the semiconductor industry has an inherent nonuniformity, a signature that reflects its configuration and the character of the process. In order to produce a process result that in the aggregate is uniform, then, it is necessary at times to deliberately introduce nonuniformities in one process step to compensate for the signature of a preceding or following process step. Alternately, in order to produce a process result that in the aggregate possesses a desired thickness contour, it is also necessary to deliberately introduce a nonuniformity in one process step to compensate for the signatures of other process steps and thereby produce, in the aggregate, the desired thickness contour. The conventional approaches described above may affect such compensation if the system or substrate configurations are symmetric but do not readily permit asymmetric compensation, especially asymmetric compensation derived from the essentially circular symmetry of semiconductor wafers.

Apparatus which may affect compensation for process step signatures generally in sputter deposited films and is suited for asymmetric compensation is disclosed in the copending application Ser. No. 325,588, of D. Harra, et. al., "Improved Blocking Shield and Method for Contouring the Thickness of Sputter Coated Layers", filed on even data herewith. The method described therein is particularly suited for producing compensation when the circular symmetry of semiconductor wafers is involved. It would be desirable to adapt such apparatus to produce asymmetric compensation, particularly compensation based on asymmetrics derived from the circular symmetry of semiconductor wafers.

BRIEF DESCRIPTION OF THE DRAWINGS

For a more complete understanding of the present invention, reference may be had to the accompanying drawings which are incorporated herein by reference and in which:

FIG. 1 is a combined graph and partial plan view of an etching system which introduces a signature having asymmetric nonuniformities;

FIG. 2 is a plan view showing a sputter coating blocking shield which is placed asymmetrically over a semiconductor wafer;

FIG. 2A is a plan view of an alternate configuration for the asymmetrically positioned blocking shield of FIG. 2.

SUMMARY OF THE INVENTION

Figure 3:
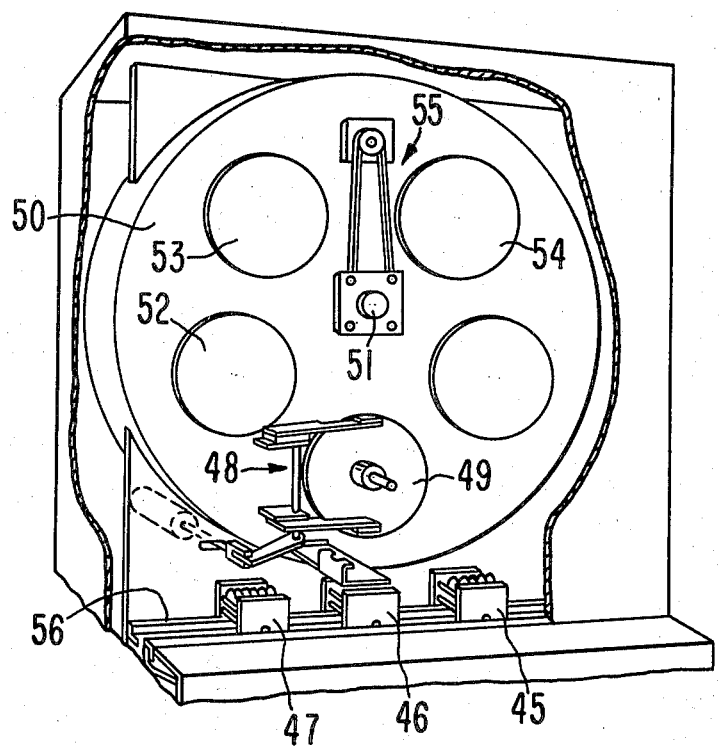
FIG. 3 is a perspective view of a multiple station cassette-to-cassette coater for practicing the method and incorporating the apparatus of the present invention.

Apparatus for compensating for asymmetric signatures in semiconductor processes is provided. The asymmetric thickness profile is obtained in a sputter coating system by using a shield placed in an asymmetric position with respect to the center of a symmetric sputtering system, preferably a circularly symmetric sputtering system. A sputter coated layer is obtained which has the asymmetric character of the shield and its placement. When the substrate is placed in subsequent equipment having asymmetric etch characteristics, the resultant film has a uniform thickness or a known contour.

DESCRIPTION OF THE PREFERRED EMBODIMENTS

The prior art systems for obtaining uniform coatings on semiconductor wafers have utilized planar shields of varying shapes which are inserted between the cathode target and the substrate. These systems are described in U.S. Pat. Nos. 3,856,654 and 3,904,503, as described above in the Background of the Invention. In these systems, there is usually relative movement, generally linear, between the substrate and the source. Either the shield is inserted in front of or removed from above the substrate or the substrate moves with respect to the source. Also, the systems do not possess or require symmetry, i.e., neither the source nor the position of the source with respect to the substrate possesses symmetry. As a consequence of the lack of symmetry in the system and of the relative linear movement, it is impossible to deliberately introduce an asymmetry in the coating of a film.

Certain semiconductor processes, particularly etching processes, introduce nonuniformities which are asymmetric, with the asymmetry being derived from the inherent circular symmetry of the round semiconductor wafer. For example, consider an etch table on which wafers are mounted around a central aperture. Reactive etchant gas is introduced through the central aperture and flows radially outward across the surface of the wafers mounted on the table. As the reactive gas etchant moves outwardly from the central aperture and performs its etching function, the reactivity diminishes. Consequently, the etch rate is lower as one moves radially outward on the etch table. Consequently, for any given wafer, the depth of etch on a given wafer along the edge closest to the central aperture will be greater than the depth of etch along the edge farthest from the central aperture. This type of asymmetric non-uniformity is illustrated, for example, in FIG. 7 of L. Kammerdiner, "Aluminum Plasma Etch Considerations for VLSI Production", *Solid State Technology*, October 1981, p. 79, 83. This kind of etch rate asymmetry, based as it is on the inherent circular symmetry of the circular semiconductor wafer, is not readily susceptible to correction by the shielding techniques of the prior art which introduce a fixed configuration shield inbetween a cathode target and a substrate. Such a fixed shield would not allow the mirror image exposure to be different. It would, therefore, be desirable to be able to apply a film to a substrate prior to such nonuniform etching, such that the final etched product would constitute a uniform film or have a known thickness contour.

An etch table which introduces an asymmetric etch is shown in the partial plan portion of FIG. 1. Etch table 10 comprises a circular plate 11 having shaped indentations 12 for receiving semiconductor wafers to be etched. When wafers 13 are in place in the shaped indentations, the side to be etched is presented generally coplanar with the surface of circular plate 11. Typically, the flats 14 of the wafers 13 are oriented in a known direction, e.g., normal to the radial direction and preferably in the same inward position. A reactive gas etchant such as CCl$_4$ is introduced through central aperture 15 which, due to the external housing of the etch system (not shown), is constrained to flow radially outwardly and pass over the exposed surfaces of semiconductor wafers 14 to thereby etch unmasked portions of these surfaces. Since the semiconductor wafers are essentially circular and since they are placed with a known orientation with respect to the central aperture 15, the etch rate as a function of radial distance from the central aperture is a significant parameter. Etch rate as a function of radial distance is shown generally as curve a in the schematic portion of FIG. 1. It drops off as a function of radial distance from the central aperture 15. Thus, an individual wafer would experience greater etching along the edge with the flat and progressively less etching across the wafer with the least depth of etch being experienced along the edge opposite the flat. The etch profile is therefore asymmetric and not readily suceptible to compensation, e.g., to the building up of a metal contour having inverse characeteristics, by the techniques of the prior art.

The present invention involves the asymmetric placement of a blocking shield 21, shown in FIG. 2, inbetween the semiconductor wafer 13 and a sputtering source (not shown). Semiconductor 13 is held in place by clips 20. Shield 21 is held in fixed, asymmetric position by wires 24 which are attached to plate 25 which in turn rests on plate 26. A commercially available system in which this invention may be practiced is the Model 3180 "Cassette-to-Cassette Coater" available from Varian Associates, Inc., Palo Alto, California. As shown in FIG. 3 and as illustrated in the product brochures entitled "3180 Cassette Coating System—the Cassette-to-Cassette Coater", available from Varian at 611 Hansen Way, Palo Alto, California 94303, semiconductor wafers are carried in cassettes 45, 46, 47 along track 56. For processing, a semiconductor wafer is loaded from a cassette 46 by an automatic wafer loading mechanism 48 through a vacuum load lock onto one of a plurality of positive-hold stations on revolving plate 50. The semiconductor wafer undergoes processing at each successive position as plate 50 is rotated about its central axis 51 by chain drive 55. Preheating, deposition, sputter etching, cooling or other similar steps, may be accomplished at the successive stations. With such an in-line system having discrete stations, it is possible to carry out sputter coating in successive steps.

Since the system has inherent circular symmetry, e.g., the semiconductor wafer is round and the plates and fixtures for holding the wafer and shield are round, it is possible to deliberately introduce an asymmetry which is derived from this circular symmetry. This is accomplished by displacing the center of shield 21 a known distance from the center of semiconductor wafer 13. The displacement is made so as to produce a sputter coated layer which compensates for the asymmetric signature of a process step such as that described in connection with FIG. 1. This is possible since the position of flat 14 with respect to the asymmetric signature is known and the position of flat 14 is known within the sputter system of FIG. 2. In many sputter systems the location of the flat is not known and it would not be possible to attempt to perform asymmetric coating. In addition, the static nature of this coating approach provides desirable mechanical simplicity. Here, the asymmetry of the signature is normal to the flat so that displacement occurs along this reference line. The extent of the displacement is determined by the severity of the asymmetry required to effect compensation.

As shown in FIG. 2A, the shape of the shield 21' need not be precisely circular, as shown previously for shield 21 in FIG. 2. The requirement is that the shield possess a symmetry which derives from the circular symmetry of the system. Thus, an elliptical shape may be employed. In this case, a line through the focii of the shield would lie in registration over the normal to the flat on the wafer.

What is claimed is:

1. In a cathode sputtering apparatus for producing an asymmetrically contoured sputter coated layer on a substrate mounted on a substrate mounting means located in opposition to a sputter source comprising a target cathode, and blocking shield means positioned inbetween said cathode target and said substrate, said blocking shield serving to block a portion of said substrate from line-of-sight communication with said target cathode, THE IMPROVEMENT COMPRISING:

said blocking shield being positioned asymmetrically and in a stationary location with respect to said substrate, said asymmetry being derived from the symmetry of said apparatus.

2. Apparatus for producing an asymmetrically sputter coated layer in accordance with claim 1 wherein said substrate mounting means is adapted to mount a semiconductor wafer having circular symmetry.

3. Apparatus for producing an asymmetrically sputter coated layer in accordance with claim 2 wherein sid blocking shield comprises a circular shield.

4. Apparatus for producing an asymmetrically sputter coated layer in accordance with claim 3 wherein the center of said block shield is displaced a fixed distance from a line normal to the center of said substrate mounting means.

5. Apparatus for producing an asymmetrically sputter coated layer in accordance with claim 2 wherein said blocking shield comprises an elliptical shield.

6. Apparatus for producing an asymmetrically sputter coated layer in accordance with claim 5 wherein the focii of the elliptical shape of said blocking shield lie in registration over a diameter of said substrate mounting means.

* * * * *